(12) United States Patent
Zens

(10) Patent No.: US 7,088,102 B1
(45) Date of Patent: Aug. 8, 2006

(54) RAPID SAMPLE MULTIPLEXING

(75) Inventor: Albert P. Zens, Salinas, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 11/071,712

(22) Filed: Mar. 3, 2005

(51) Int. Cl.
*G01V 3/00* (2006.01)

(52) U.S. Cl. ..................... 324/321; 324/318

(58) Field of Classification Search ............. 324/321, 324/318, 307
See application file for complete search history.

(56) References Cited

U.S. PATENT DOCUMENTS

| | | | |
|---|---|---|---|
| 4,549,136 A | | 10/1985 | Kassel et al. |
| 4,654,592 A | * | 3/1987 | Zens ................. 324/307 |
| 5,705,928 A | | 1/1998 | Haner et al. |
| 6,414,491 B1 | | 7/2002 | Higgins et al. |
| 6,696,838 B1 | | 2/2004 | Raftery et al. |
| 6,768,305 B1 | | 7/2004 | Keifer |
| 6,937,020 B1 | * | 8/2005 | Munson et al. ......... 324/321 |

OTHER PUBLICATIONS

Article by MacNamara, et al. entitled "Multiplex Sample NMR: An Approach to High-Throughput NMR using a Parallel Coil Probe", published by Analytica Chimica Acta 397, (1999), pp. 9-16.

Article by Li, et al., entitled "Multiple Solenoidal Microcoil Probes for High-Sensitivity, High-Throughput Nuclear Magnetic Resonance Spectroscopy", published by Analy. Chem., 71, pp. 4815-4820.

Internet article by Redfield, A.G. entitled "Shuttle for Commercial NMR Spectrometers", http://www.bio-brandeis.edu/faculty01/redfield/shuttleIII.pdf,May 15, 2000.

* cited by examiner

*Primary Examiner*—Louis M. Arana
(74) *Attorney, Agent, or Firm*—Edward H. Berkowitz; Bella Fishman

(57) ABSTRACT

A time multiplex arrangement for presenting multiple samples to a single channel of NMR excitation/data acquisition includes means for rapid exchange of physical position between plural samples or sample portions from the measurement volume of the NMR instrument while said samples remain in a substantially the same homogeneous magnetic field. While a delay is imposed upon time evolution or relaxation of an NMR excited sample outside the sensitive volume of an RF resonator, another sample is actively excited within said RF resonator whereby the steps of NMR measurement are overlapped between at least two samples.

12 Claims, 5 Drawing Sheets

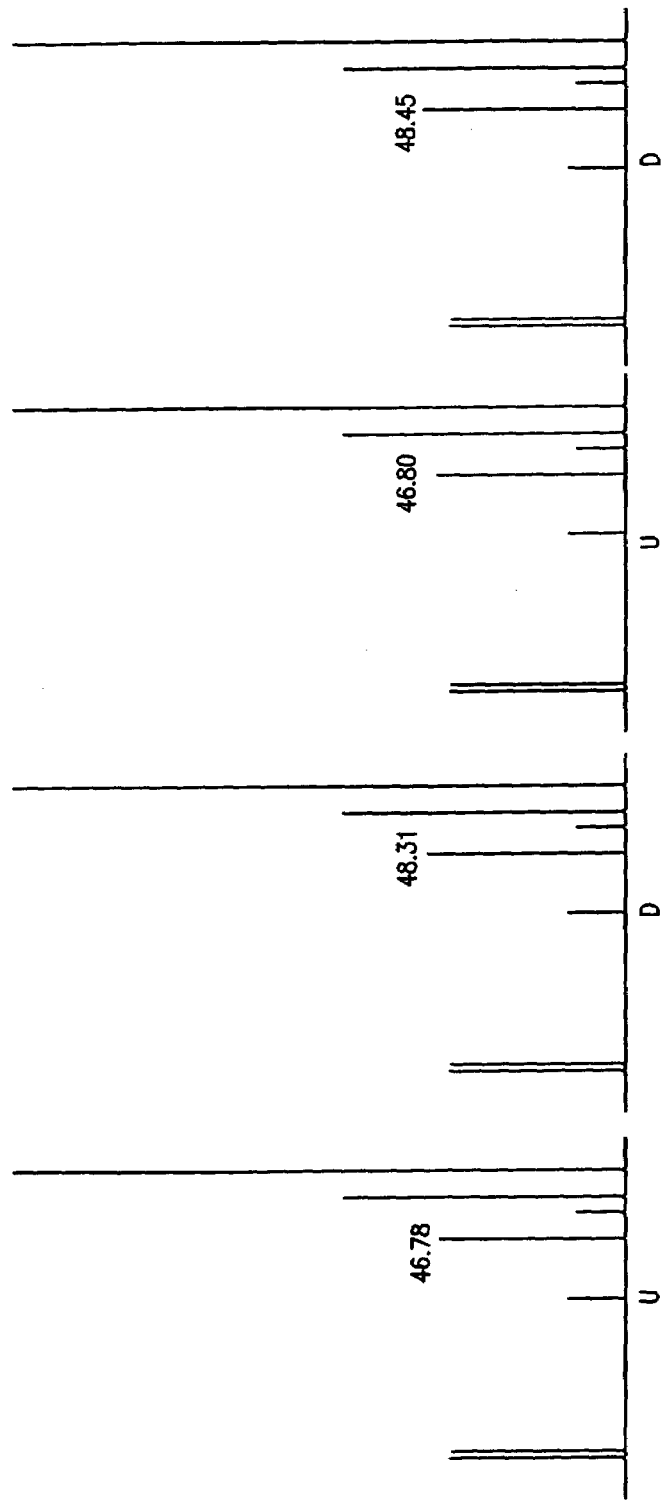

RAPID SAMPLE MULTIPLEXING

FIELD OF THE INVENTION

The invention is in the field of nuclear magnetic resonance apparatus and pertains particularly to improved efficiency in the measurement of plural samples.

BACKGROUND OF THE INVENTION

The efficient analysis of a number of samples through nuclear magnetic resonance (NMR) has been the subject of development over the course of many years. One major limit to throughput is the physical insertion and removal of samples from the sensitive region of the apparatus. Prior art has been directed to placement of a number of samples within the bore of the NMR magnet with suitable mechanical conveyance of a sample into the sensitive volume for measurement with subsequent removal and advancement of the next sample into the sensitive volume. These arrangements increase throughput by minimizing the time required for the placement and removal of samples and simplification of the sample handling operations. Examples are U.S. Pat. No. 6,414,491 and U.S. Pat. No. 6,768,305, both commonly assigned herewith. Additionally, certain complex experiments, such as those requiring temperature regulation at non-ambient conditions, have exploited an overlap of measurement of the instant sample with temperature preparation of the next sample(s) as described in U.S. Pat. No. 6,768,305. The latter is an example of the concurrence of steps required for different samples.

It is also known in prior art to employ differential pressure control for a sample conduit to accurately position individual samples within the sample volume. In this art, both ends of the sample conduit are pressurized with an inert gas and pressure regulation is available at both ends whereby the pressure differential is controlled in magnitude and sign. Discrete samples are precisely positioned using the differential pressure in combination with processing of the NMR signal from the sample to optimize that signal in respect to sample position, as described by U.S. Pat. No. 5,705,928 commonly assigned herewith and incorporated by reference.

It is known in prior art to rapidly transport a particular sample for analysis from one magnetic field region of an NMR magnet (high field) to another region (low field) for certain types of experiments. Sample shuttles for such physical transfer are well known. This is done cyclically for the purposes of the specific analytic process directed to the particular sample. An example of this is described by Redfield, http://www.bio.brandeis.edu/faculty01/redfield/shuttleIII.pdf,May15,2000.

Prior art approaches to increasing sample throughput contemplate multiplexing of apparatus, such as multiple RF resonators. Coupling between different sample channels presents problems, particularly because of concurrent process steps occurring in close physical proximity. Multiple independent and quasi-independent channels with duplicate hardware present considerable complexity in operation and calibration. In such apparatus, it is apparent that the several samples are subject to measurements in different regions of the magnetic field, in proximity to different sources of transient disturbances, and within different resonator structures.

It is conventional for NMR measurements to be repeated a sufficient number of times to complete an averaging process. Such averaging is often required to enhance (coherent) true signal with respect to (incoherent) noise. In other types of experiment, a substantial time delay is an integral step of the particular pulse sequence defining the measurement. Heretofore, whether an integral portion of a pulse sequence or the interval between repetitions, these delays have been regarded as an irreducible component of experiment throughput.

SUMMARY OF THE INVENTION

Multiple samples in the bore of an NMR magnet inherently experience the polarization of the main magnetic field. When positioned in the sensitive volume within the RF resonator, the sample may then be subject to nuclear spin manipulation by an applied RF field pulse and/or de-excitation. In a simple straightforward case where a simple 90° pulse is followed by data acquisition, one might traditionally delay repetition of the measurement (for averaging purposes) by an interval of sufficient length in comparison with the characteristic relaxation time $T_1$, i.e., $5T_1$. Such a lengthy delay provides almost complete relaxation of the nuclear spins necessary for repetition of the measurement to enhance signal-to-noise performance or to allow phase cycling of a pulse sequence. One aspect of the present invention is the use of this relaxation interval (for a first sample) to perform measurement steps on one or more other samples, after which the cycle may be repeated for the same samples. The delay, or relaxation interval allows the evolution of the rotating spin system in the polarizing field. Displacement of a sample within the region of homogeneity does not disturb such evolution and permits multiple samples within such homogeneous magnetic field space to be moved in and out of the sensitive region (or "window") of the RF coil without disturbance of the evolving spin system(s).

The time multiplex of samples in a common RF excitation space (sensitive volume) is not limited to that delay conventionally occurring between separate NMR measurements and thus including a data acquisition interval (an inter-experiment delay). Delays of substantial length are integral to a number of classes of pulse sequences, such as spin echo experiments. These intra-experiment delays also provide an opportunity for overlap of measurements directed to separate samples.

In one embodiment, the invention contemplates a long physically continuous sample, or physically discrete portions of a common body of homogeneous sample, or physically distinct samples. In these arrangements, the sample portions are disposed in fixed relative axial position and capable of rapid transport into and out of the RF sample coil using, for example, differential gas pressure control, or direct mechanical linkage of the sample container, or like arrangements for physical translation of the samples along the axis of the RF resonator.

Another embodiment presents distinct samples mutually separated by a suitable fluid or bubble for rapid positioning within an RF resonator and removal therefrom.

BRIEF DESCRIPTION OF THE FIGURES

FIGS. 3a–d inclusive show spectra obtained from a pair of nominally identical samples, following the invention.

DETAILED DESCRIPTION OF THE INVENTION

Modern NMR measurements are defined by a pulse sequence that consists of manipulations of the nuclear spin of a selected nuclear species by application of RF energy in a specified manner(s), delay intervals and finally, a data acquisition period. A pulse sequence may comprise a single RF excitation or a rather large number thereof. Such pulses may be separated by delay intervals that, in some cases may be rather lengthy. It is nearly always the case that such measurement is repeated a number of times to average out incoherent noise while emphasizing the coherent effect. Such repetition requires a sufficient delay between these individual measurements for the effect of the previous measurement to decay away before initiating the next repetition. Let this latter delay be thought of as an inter-experiment delay whereas those delays that define the structure of the pulse sequence itself are regarded as intra-experiment delays. Whereas both of these delays may provide implementation of the present invention, the most easily understood example of the invention occurs with the inter-experiment delay between the termination of RF activity in the course of a first measurement and the initiation of RF activity incident to a subsequent measurement. In such example, this interval is occupied partially by the acquisition of data. Modern NMR data is acquired in the time domain and is not continued beyond a selected time interval. At least, data acquisition is not continued beyond that time where the average signal power unacceptably approaches the noise power as the signal time dependence attenuates. The experiment cannot be immediately repeated until the signal power is acceptably small compared to the noise without the possible contamination of subsequent measurement by the lingering effect of the earlier excitation. Such parasitic effect is likely to be compounded by numerous repetitions of the spin manipulations. The time dependence for the dissipation of the signal is called the relaxation time and depends upon the exchange of energy between the nuclear spins and their environment. A typical parameter characterizing this dissipation is called $T_1$, the spin lattice relaxation time.

Figure 1A:
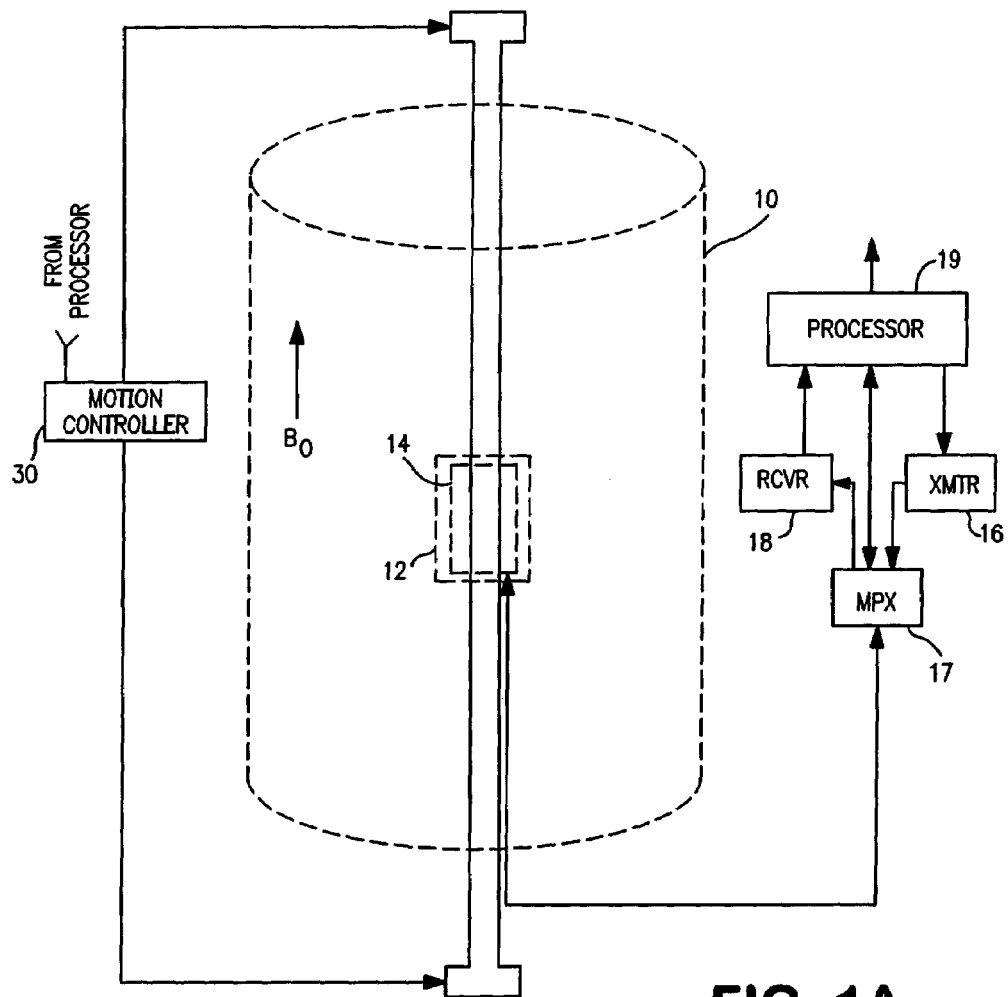
FIG. 1a illustrates one embodiment of the invention.

A simple characterization of the invention is illustrated in FIG. 1 with the example of two discrete samples U and D residing in the bore 10 of an NMR magnet (not otherwise pictured). Both samples are subject, in common, to the polarizing field $B_0$ along the axis Z and one sample, D, is positioned within the RF resonator 14, defining the sensitive volume 12 of the apparatus. The RF resonator 14 may be a saddle coil, solenoid, birdcage coil, cavity, etc. For simplicity assume a simple RF pulse 20 is derived from RF source 16 and applied through multiplexer 17 and resonator 14 to this sample D followed by acquisition of data from resonator 14 through multiplexer 17 to receiver 18 for a waveform acquire time 22. Instrument operation is controlled conventionally by processor 19, which also controls the sample selection and position through motion controller 30. Motion controller 30 communicates with processor 19 and operates the motive means for moving samples into and out of the measurement volume. The motive means may constitute a stepping motor with mechanical linkage to the multi-sample tube (such as a reciprocating arm, in one simple mechanical arrangement) or an arrangement of valves and a pressure source and/or vacuum sink for propelling samples in a sample conduit as disclosed in U.S. Pat. No. 5,705,928. FIG. 2 is a schematic timing diagram for the essential steps of a set of repetitive measurements directed to both samples. As acquisition of data terminates, a first sample (D) is rapidly removed from the RF resonator and a second sample CU) is rapidly positioned in the sensitive volume under control of motion controller 30. The second sample (U) is subject to the desired NMR measurement and at the conclusion of data acquisition for this second sample, it is rapidly removed from the sensitive volume 12, the first sample D is rapidly replaced in the RF resonator and subsequent measurement on the first sample D is resumed. Notice that while displaced away from the sensitive volume 12, the first sample continues to relax while the second sample is positioned in the RF resonator 14 and subject to an NMR measurement or measurement step.

Figure 1B:
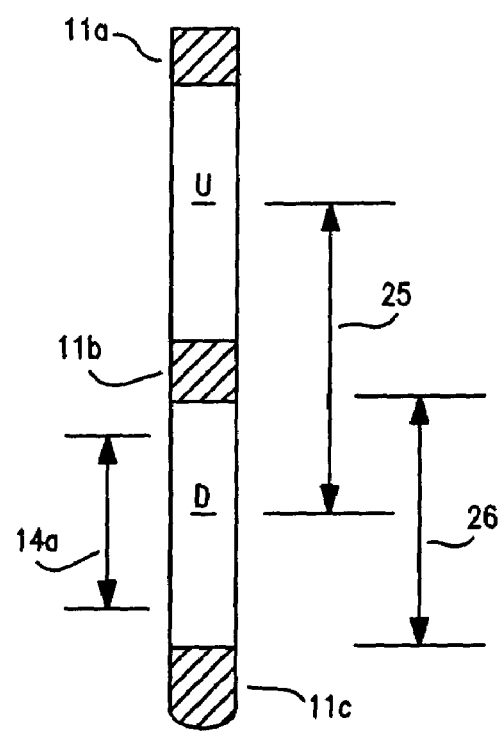
FIG. 1b is a sample tube for practice of one embodiment of the invention.
Figure 2:
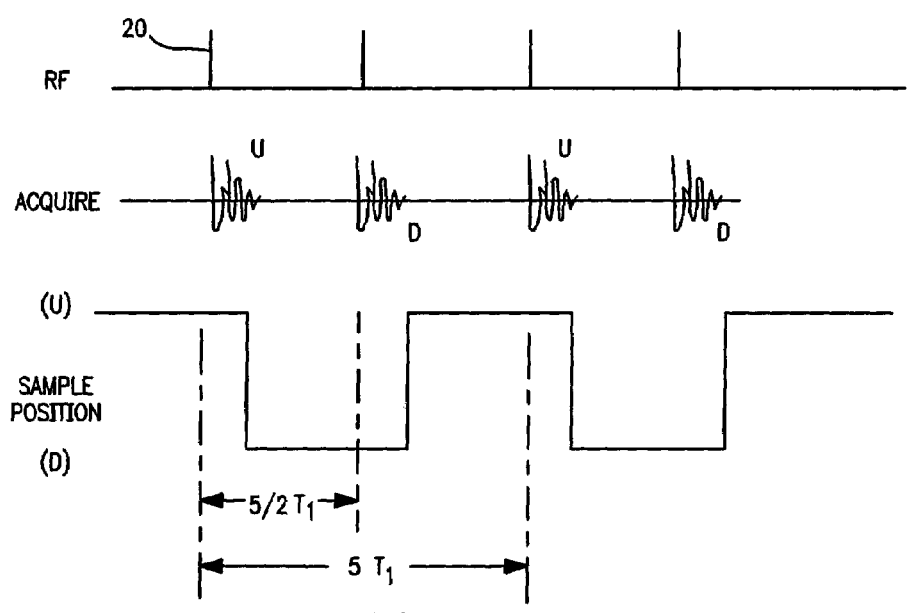
FIG. 2 is a timing diagram for a simple example of the invention.

FIG. 1b is a conventional sample container modified to accommodate two distinct samples delimited with susceptibility plugs 11a, 11b, and 11c for improved magnetic character of the entire (composite) sample and sample tube. Susceptibility plugs are described in U.S. Pat. No. 4,549,136 commonly assigned herewith. Of note here are the relationships of several dimensions for practice of the particular embodiment. The axial extent of the sample is significantly longer than the axial extent 14a of the RF resonator to assure that the RF field acts only upon the sample properly positioned within the RF resonator. The physical displacement, or stroke 25 is of a length to align the respective centers of the two discrete samples with the center of the RF resonator. This alignment is less critical with a large value for the ratio of sample length 25 to resonator length 14a and substantially homogeneous RF field.

The physical implementation for motion control may be achieved through various implementations. Differential gas pressure as employed in prior art may be used to dispose one or the other of the two samples into the resonator 14. Direct mechanical coupling through a rigid linkage represents another approach. In one implementation, a composite sample tube is coupled to a rigid (non-magnetic) tube arranged for suction coupling to one end of the sample tube.

Figure 4B:
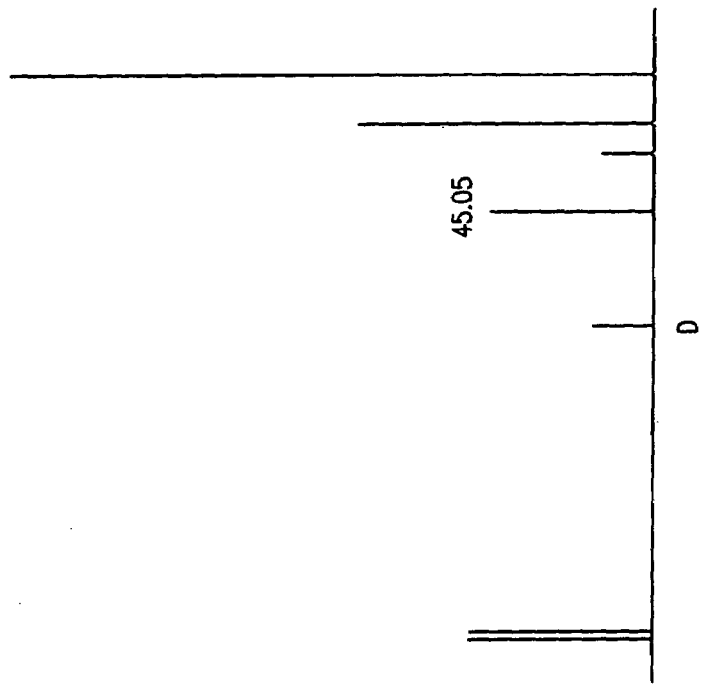
FIGS. 4a–b shows a comparison of conventional separate data acquisitions from the same samples.
Figure 4A:
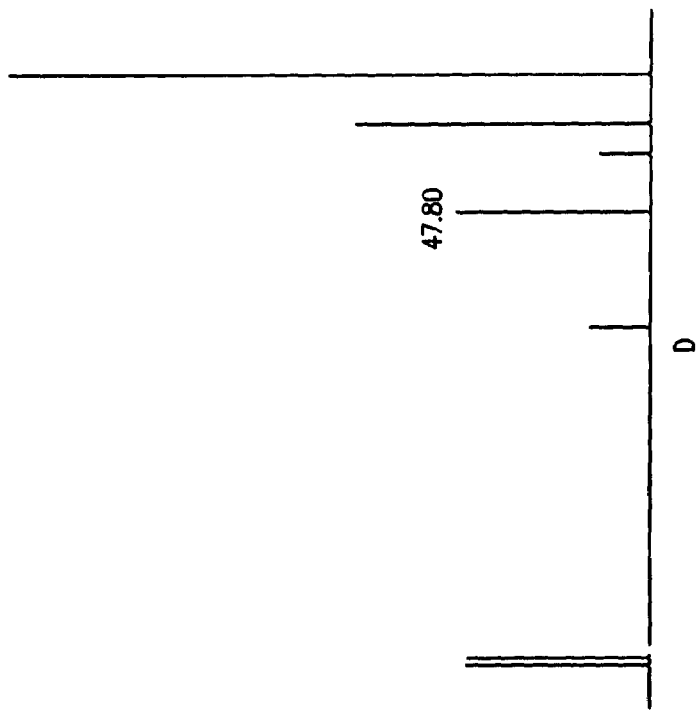

The overlap of measurements of two discrete samples (of identical content for test purposes) has been carried out in a simple prototype of the inventive method. The two (identical) samples (ibuprofen in chloroform), separated by a susceptibility plug were housed in a standard 8 cm NMR sample tube. The total length of the two samples including the separating susceptibility plug 11a was 5 cm. The axial extension of the window of the RF coil was 1.8 cm. When one sample was centered in the sensitive volume defined by the window of the RF resonator, the other sample was 2.5 cm distant from the end of the window of the RF coil. A simple 90°-acquire—relaxation delay sequence was applied to a first sample (denoted U). Data acquisition terminated at 1.4 seconds following the RF pulse and concurrently therewith, the sample tube was rapidly translated to center the second sample (denoted D) in the measurement space of the RF coil. For this test, the transit time between sample positions was of the order of tens of milliseconds. The experimental sequence was repeated with the opposite directed translation of the sample tube to restore sample U to the sensitive volume. The total interval between RF excitations of the same sample was $5T_1$. Spectra of each of two excitations of each of the two samples, obtained in the overlapped method of the invention, is shown in FIGS. 3a–d. The observed amplitudes of the indicated peak are shown in brackets and serve to establish the reproducibility of the measurements and provide an indication of the signal-to-noise (SNR)

parameter. The acquisition of the four spectra consumed 41 seconds. For a control comparison, conventional (prior art) non-overlapped acquisition of two spectra, e.g., two successive transients, required 42.8 seconds, as shown in FIGS. 4a–b. The SNR quality of the overlapped acquisitions is in excellent agreement with the control spectra. The amplitude of a selected peak is noted on each of the spectra of FIGS. 3 and 4. Spectra of samples "U" and "D" differ slightly for instrumental reasons, such as minor asymmetries of the sample carrier and environs. However, the reproducibilty of spectra from corresponding samples is excellent.

It is necessary to point out that this overlap of process steps is not limited to the case of any particular number of samples; not limited to nominally identical samples; not limited to identical pulse sequences for different samples; and, not limited to delays of the inter-measurement variety. The relative durations of available delay and requirements of the prescribed RF manipulation, the time requirement for physical translation of sample along the bore of the magnet; positional hysteresis, where precision positioning (relative to RF magnetic field homogeneity for example) is required; these are relevant to design of suitable overlapping measurements. One may observe that overlapped measurement of samples of different composition may raise problems of magnetic field shimming. Further, for more than two samples presented in overlapped measurement, there may be an asymmetry in the time overhead for adjacent sample disposition to/from the sensitive region and the return of the "first" sample to the sensitive region. This need not be deleterious to the procedure, and dissimilar sample types may benefit from the overlapped throughput of the invention, but these issues are noted for consideration.

The continued presence of the multiple samples within the polarizing field offers the same benefits of overlap during delays forming an integral portion of a pulse sequence. Consider a spin echo experiment containing intervals adjacent an echo pulse. The evolution of the phase of the nuclear spins within a sample continue while the sample is displaced from the immediate environs of the RF resonator because the displaced sample remains in the same polarizing field.

The mechanism for rapid sample transport may be achieved by various means. In the illustrative experiment of FIG. 2a direct mechanical stroke manipulates the sample positions. In a variation of the embodiment of FIG. 1a, another differential pressure technique is employed wherein samples are entrained between fluid-filled spaces. The fluid filled space may comprise a bubble in appropriate circumstances where requisite resolution so permits. The sample container may take discrete form for containing a fixed plurality of samples to be presented for overlapped measurements. Such sample conduit will require removal from the instrument at the completion of the overlapped analysis and replacement with another multi-sample conduit. Another embodiment contemplates a "continuous" flow of groups of samples, discrete or continuous in nature. The overlapped measurements carried out upon 2,3 or N adjacent samples entail translation of particular samples of the group into and out of the resonator defined volume using differential pressure techniques (such as referenced above), wherein the completion of an overlapped set of sample measurements terminates with a flush of these analyzed samples of the group from one end of the sample conduit while a fresh set of samples (sample group) is admitted to the other end. In yet another embodiment, a single homogeneous sample may be subject to a plurality of different analyses (different pulse sequences or experimental parameters). The sample is translated to present a different, e.g., second axial increment of sample to the resonator 14 during a selected delay interval of the pulse sequence associated with a first axial increment of sample. Thereafter, the first axial increment is restored to the resonator 14 for continuation of the respective pulse sequence. In this manner, differing analytic procedures may be practiced upon a common sample exploiting the overlapped techniques of the invention.

Carousel-like apparatus is well known for the purpose of automated (single) sample introduction to an NMR probe. A carousel of suitable dimensions, scaled for disposition within the magnet bore, could receive samples in corresponding sample conduits along the carousel axis parallel with, and offset from the bore of the magnet. The carousel is rapidly rotatable to place a selected sample on the axis of the RF resonator. A motion controller (either pneumatic or mechanical, as the case may be) then operates in response to instruction to insert or retrieve the sample from the measurement volume of the RF resonator for conveyance to, or from the corresponding sample conduit of the carousel. Gas pressure, applied to each sample conduit at both ends thereof, or a mechanical linkage coupled to the sample conduit provides the actuating mechanism for in-bore manipulation. The entire carousel might be transported out of the bore for re-loading and re-insertion, or an external mechanism may be constructed for re-loading the in-bore carousel in place. The detail of such apparatus is outside the scope of the present invention, but adapting such apparatus for operation within the bore of the magnet furthers the overall goal of increasing the throughput of NMR measurements because the proximity of the carousel to the resonator reduces the time overhead for introduction/retrieval of sample groups.

Although this invention has been described with reference to particular embodiments and examples, other modifications and variations will occur to those skilled in the art in view of the above teachings. For example, it has also been noted that alternate approaches to enhanced throughput for NMR measurements have employed a hardware mutliplex of separate measurement channels: the present invention is applicable in such circumstance to optimize each of those channels. It should be understood that, within the scope of the appended claims, this invention may be practiced otherwise than as specifically described.

What is claimed is:

1. A method for increasing the throughput for NMR measurements that employ pulse sequences comprising RF manipulations of nuclear spins, delay intervals and data acquisition, said method comprising the steps of:
   a) introducing a plurality of samples to the polarizing field of an NMR apparatus, a first said sample occupying a sensitive volume within an RF resonator for receiving said RF spin manipulation;
   b) performing said RF manipulation to said first sample;
   c) initiating a delay interval for said first said sample and during said delay interval,
      i) removing said first sample from said RF resonator,
      ii) disposing a second said sample to said sensitive volume,
      iii) executing a portion of another said pulse sequence directed to said second sample, and
   d) removing said second sample from said sensitive volume.

2. The method of claim 1, further comprising replacing said first sample to said sensitive volume and performing a further step of said pulse sequence.

3. The method of claim 1, wherein said delay is an inter-experiment delay.

4. The method of claim 1, wherein said delay is an intra-experiment delay.

5. The method of claim 1, wherein said plurality of samples are of similar composition.

6. The method of claim 1, wherein said plurality of samples are of diverse composition.

7. The method of claim 1, wherein said plurality of samples comprise distinct volume increments of a common sample portion.

8. An apparatus for the overlap in time of steps of an NMR experiment directed independently to a plurality of samples, comprising:

an NMR apparatus comprising a magnet, which produces a homogeneous field throughout a uniform magnetic field space in a bore of said magnet, an RF energy source and at least one RF resonator selectively coupled to said RF sound disposed within said uniform magnetic field space for the NMR excitation of a sample disposed within a sensitive volume defined by said resonator, and an RF receiver selectively coupled to said resonator acquiring a resonant signal from said sample within said sensitive volume;

a sample container comprising an axis parallel to said bore, which contains a plurality of axially extended samples; and sample positioning means responsive to a motion controller disposing one said sample, which receives an RF spin manipulation within said sensitive volume while retaining another said sample undergoing relaxation within said magnetic field space outside said sensitive volume, and exchanging positions of said samples in relation to said resonator, wherein the step of spin manipulation of said one sample and the step of relaxation of said another sample are overlapped in time.

9. The apparatus of claim 8, wherein said sample positioning means comprises a mechanical linkage between said sample container and a stepping motor.

10. The apparatus of claim 8, wherein said sample positioning means comprises a sample conduit containing a plurality of fluid samples and a differential pressurization controller coupled to ends of said conduit translating said fluid samples in either direction along the axis of said sample conduit.

11. The apparatus of claim 8, wherein said plurality of axially extended samples are coaxially aligned.

12. The apparatus of claim 11, comprising means for translating said sample container aligned with said resonator, which displaces a portion of said sample container into said sensitive volume and withdraw one said sample from said sensitive region.

* * * * *